(12) United States Patent
Nishimura

(10) Patent No.: US 7,611,983 B2
(45) Date of Patent: Nov. 3, 2009

(54) SEMICONDUCTOR DEVICE AND A MANUFACTURING METHOD OF THE SAME

(75) Inventor: Akihito Nishimura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 159 days.

(21) Appl. No.: 11/513,029

(22) Filed: Aug. 31, 2006

(65) Prior Publication Data

US 2007/0224802 A1    Sep. 27, 2007

(30) Foreign Application Priority Data

Mar. 23, 2006    (JP) .............................. 2006-081480

(51) Int. Cl.
*H01L 21/4763* (2006.01)
*H01L 21/76* (2006.01)
*H01L 21/31* (2006.01)
*H01L 21/469* (2006.01)

(52) U.S. Cl. ....................... 438/624; 438/637; 438/428; 438/438; 438/781

(58) Field of Classification Search ................. 438/438, 438/618, 434, 428, 424, 405
See application file for complete search history.

(56) References Cited

U.S. PATENT DOCUMENTS

2002/0197816 A1*    12/2002    DeBoer ...................... 438/396

FOREIGN PATENT DOCUMENTS

| JP | 08-274066 A | 10/1996 |
|---|---|---|
| JP | 9-148434 A | 6/1997 |
| JP | 10-50835 A | 2/1998 |
| JP | 2000-195950 A | 7/2000 |
| JP | 2003-197739 A | 7/2003 |

* cited by examiner

*Primary Examiner*—Ha Tran T Nguyen
*Assistant Examiner*—Valerie Brown
(74) *Attorney, Agent, or Firm*—Fujitsu Patent Center

(57) ABSTRACT

A first BPSG film covering a transistor is formed. Next, a second BPSG film is formed on the first BPSG film. The B concentration in the first BPSG film is about five times higher than the B concentration in the second BPSG film. Next, the first BPSG film is separated into a part of a source diffusion layer side and a part of a drain diffusion layer side, with a gate electrode being a boundary. Subsequently, a contact hole reaching the source diffusion layer is formed in the first and second BPSG films. Then, by removing the first BPSG film exposed to the contact hole by isotropic etching, a hollow portion is formed between the source diffusion layer and the second BPSG film. Then, a barrier metal film made of TiN or the like is formed in the hollow portion.

21 Claims, 13 Drawing Sheets

FIRST DIRECTION
SECOND DIRECTION

SEMICONDUCTOR DEVICE AND A MANUFACTURING METHOD OF THE SAME

CROSS-REFERENCE TO RELATED APPLICATIONS

This application is based upon and claims the benefit of priority from the prior Japanese Patent Application No. 2006-081480, filed on Mar. 23, 2006, the entire contents of which are incorporated herein by reference.

BACKGROUND OF THE INVENTION

1. Field of the Invention

The present invention relates to a semiconductor device in which a silicide technology is unnecessary and to a manufacturing method of the same.

2. Description of the Related Art

Recently, a silicide technology is applied to a transistor in order to reduce resistance, but a cost increases when the silicide technology is applied. Therefore, a silicide layer is not formed in a transistor in which reduction of resistance is not particularly required. As such a transistor, there can be cited, for example, a transistor constituting a memory cell array.

Here, a conventional semiconductor device will be described. FIG. 4 is a cross-sectional view showing the conventional semiconductor device. An element isolation insulating film 102 is formed on a surface of a substrate 101, and two field-effect transistors are formed in an element region defined by the element isolation insulating film 102. In each of the transistors, a tunnel insulating film 103, a floating gate 104, an insulating film 105, a control gate 106, a sidewall 107, a source diffusion layer 141, and a drain diffusion layer 142 are formed. Additionally, an interlayer insulating film 110 covering the transistors is formed. In the interlayer insulating film 110, there are formed a contact hole reaching the source diffusion layer 141 and contact holes reaching the drain diffusion layers 142, and in those contact holes contact plugs 114 are formed. On the interlayer insulating film 110, wirings 115 contacting the contact plugs 114 are formed. Other interlayer insulating films, wirings and the like are formed (not shown) on the wirings 115 and the like. Incidentally, the source diffusion layer 141 of each transistor is shared by the respective transistors.

As described above, a transistor in which a silicide layer is not formed has been conventionally used as the transistor constituting the memory cell array in view of the cost and the like. However, recently, faster operation and reduced driving voltage are required in such a transistor.

Related arts are disclosed in Japanese Patent Application Laid-open No. 2003-197739, Japanese Patent Application Laid-open No. 2000-195950, Japanese Patent Application Laid-open No. Hei 9-148434, Japanese Patent Application Laid-open No. Hei 10-50835, and Japanese Patent Application Laid-open No. Hei 8-274066.

SUMMARY OF THE INVENTION

An object of the present invention is to provide a semiconductor device in which resistance can be reduced even without using a silicide technology, and a manufacturing method of the same.

As a result of keen examination to solve the above problem, the present inventor has conceived aspects of the invention described below.

A semiconductor device according to the present invention is provided with: a semiconductor substrate; an impurity diffusion layer formed on a surface of the semiconductor substrate; transistors in which the impurity diffusion layer is a source diffusion layer or a drain diffusion layer; an interlayer insulating film covering the transistors; and a contact plug connecting to the impurity diffusion layer and being formed in the interlayer insulating film. The semiconductor device is further provided with a conductive film being constituted with the same material as a material constituting the contact plug, and being formed on the impurity diffusion layer.

In a first manufacturing method of a semiconductor device according to the present invention, after forming a transistor having a gate electrode, a first impurity diffusion layer and a second impurity diffusion layer on a surface of a semiconductor substrate, a first insulating film covering the transistor is formed. Next, a second insulating film is formed on the first insulating film. Then, the first insulating film is separated into a part of the first impurity diffusion layer side and a part of the second impurity diffusion layer side, with the gate electrode being a boundary. Subsequently, a contact hole reaching the first impurity diffusion layer is formed in the first and the second insulating films. Thereafter, a hollow portion is formed between the first impurity diffusion layer and the second insulating film by removing the first insulating film exposed to the contact hole. Then, a conductive film is formed in the hollow portion.

In a second manufacturing method of a semiconductor device according to the present invention, after forming a transistor having a gate electrode, a first impurity diffusion layer and a second impurity diffusion layer on a surface of a semiconductor substrate, a first insulating film which is apart from the second impurity diffusion layer is formed on the first impurity diffusion layer. Next, a second insulating film covering the transistor and the first insulating film is formed. Then, a contact hole reaching the first impurity diffusion layer is formed in the first and the second insulating films. Subsequently, a hollow portion is formed between the first impurity diffusion layer and the second insulating film by removing the first insulating film exposed to the contact hole. Then, a conductive film is formed in the hollow portion.

DETAILED DESCRIPTION OF THE PREFERRED EMBODIMENTS

Figure 1A:
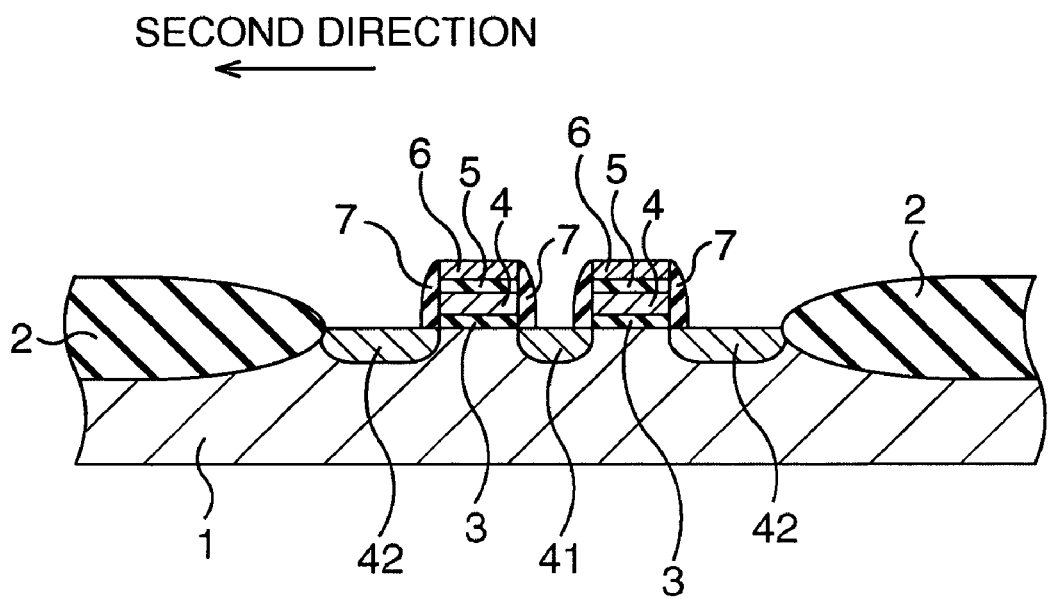
FIG. 1A to FIG. 1K are cross-sectional views showing a manufacturing method of a semiconductor device according to an embodiment of the present invention step by step.

Hereinafter, an embodiment of the present invention will be described specifically with reference to the attached drawings. A structure of the semiconductor device will be described along with a manufacturing method thereof for the sake of convenience. FIG. 1A to FIG. 1K are cross-sectional views showing the manufacturing method of a semiconductor device according to the embodiment of the present invention step by step. FIG. 2A to FIG. 2K are also cross-sectional views showing the manufacturing method of a semiconductor device according to the embodiment of the present invention step by step. The cross sections shown by FIG. 1A to FIG. 1K and the cross sections shown by FIG. 2A to FIG. 2K are orthogonal to each other. FIG. 3 is a view showing a layout of the semiconductor device according to the embodiment of the present invention. FIG. 1A to FIG. 1K show the cross sections along a line I-I in FIG. 3, while FIG. 2A to FIG. 2K show the cross sections along a line II-II in FIG. 3.

In the present embodiment, as shown in FIG. 3, two control gates 6 extend in a first direction, and below the respective control gates 6 a plurality of floating gates 4 are located. In the first direction, element isolation insulating films 2 are located between the floating gates 4 next to each other. Additionally, a source diffusion layer (impurity diffusion layer) 41 extending in the first direction is located between the two control gates 6. Further, in a second direction orthogonal to the first direction, drain diffusion layers (impurity diffusion layers) 42 are located outside the two floating gates 4 next to each other across the source diffusion layer 41. A contact plug 14 for drain is provided per drain diffusion layer 42. To the source diffusion layer 41, a contact plug 14 for source is provided. Sidewalls 7 are located around the control gates 6. Additionally, a conductive barrier metal film (not shown in FIG. 3) is formed in a region between the two sidewalls 7 on the source diffusion layer 41. As described above, transistors constituting a memory cell of a flash memory are arranged in an array.

Next, a manufacturing method for obtaining the structure shown in FIG. 3 will be described. In the present embodiment, first, a plurality of element active regions are divisionally provided by forming an element isolation insulating film 2 on a surface of a substrate 1 made of p-type silicon or the like, as shown in FIG. 1A and FIG. 2A. Next, two transistors are formed in each of the element active regions. When forming the transistor, there is performed formation of a tunnel insulating film 3, a floating gate 4, an insulating film 5 and a control gate 6, a sidewall 7, and a source diffusion layer 41 and a drain diffusion layer 42. It should be noted that the source diffusion layer 41 is shared between the two transistors. Additionally, as shown in FIG. 3, the control gates 6 and the source diffusion layer 41 are shared between the plural transistors next to one another in the first direction.

Figure 1B:
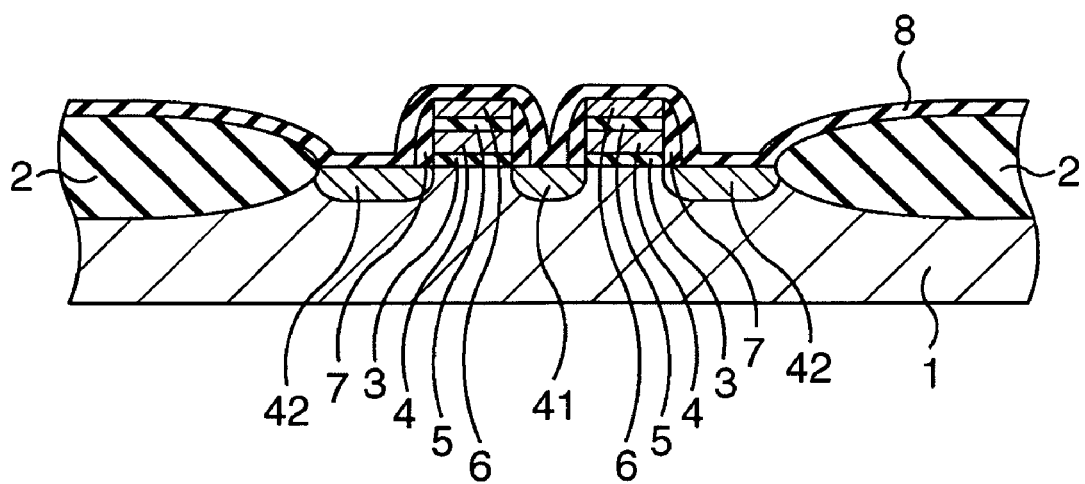
Figure 2A:
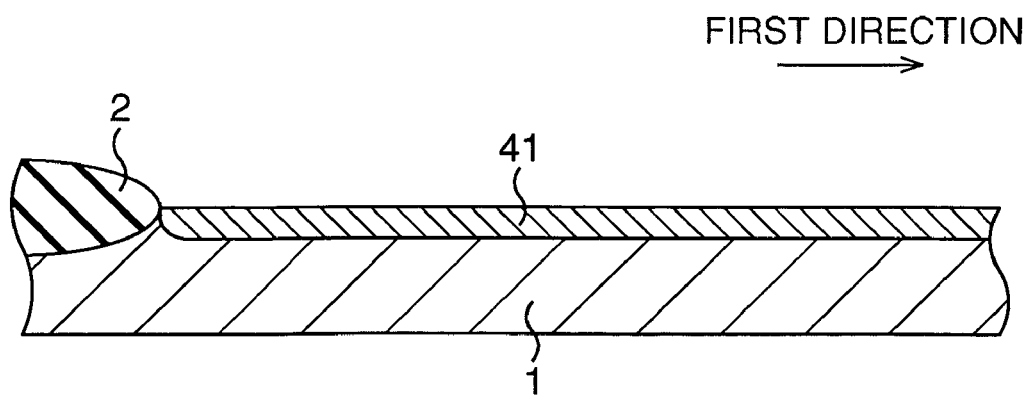
FIG. 2A to FIG. 2K are cross-sectional views showing the manufacturing method of a semiconductor device according to the embodiment of the present invention step by step.
Figure 2B:
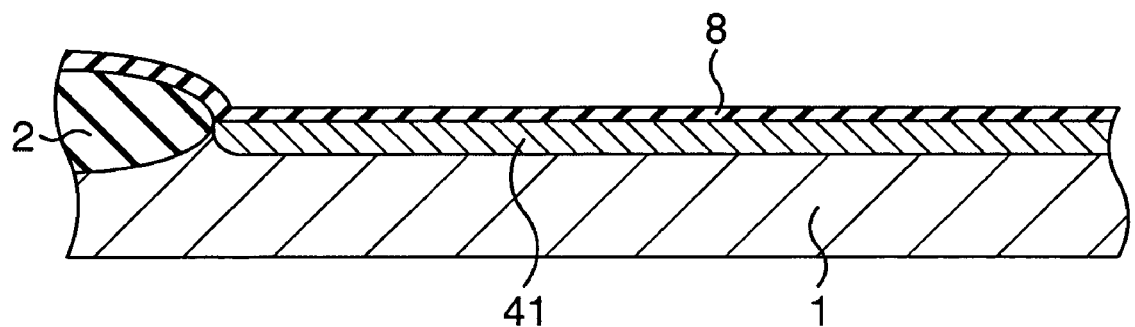
Figure 3:
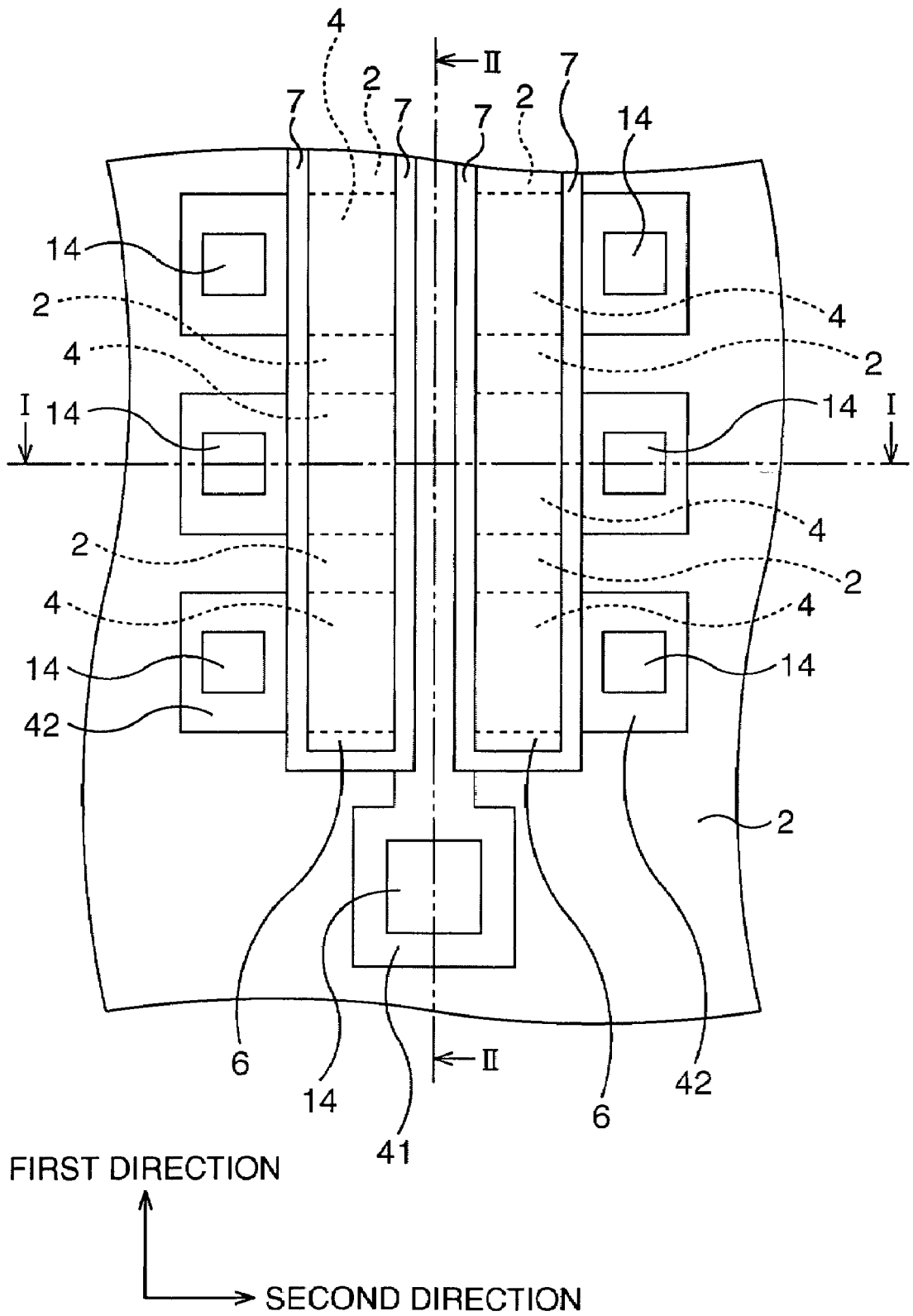
FIG. 3 is a view showing a layout of the semiconductor device according to the embodiment of the present invention.
Figure 4:
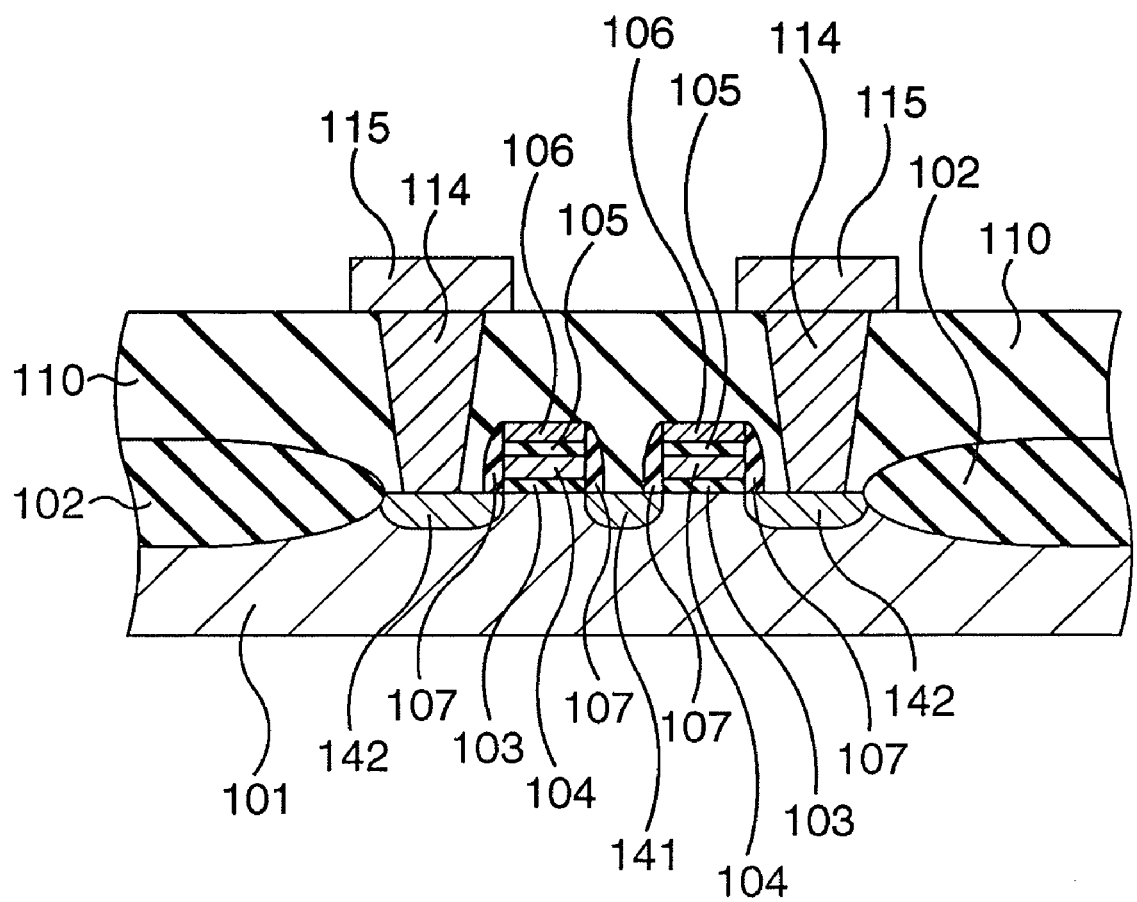
FIG. 4 is a cross-sectional view showing a conventional semiconductor device.

Next, as shown in FIG. 1B and FIG. 2B, a BPSG (Boron Phosphor Silicate Glass) film 8 is formed on an entire surface. A thickness of the BPSG film 8 is, for example, about 50 nm.

Figure 1C:
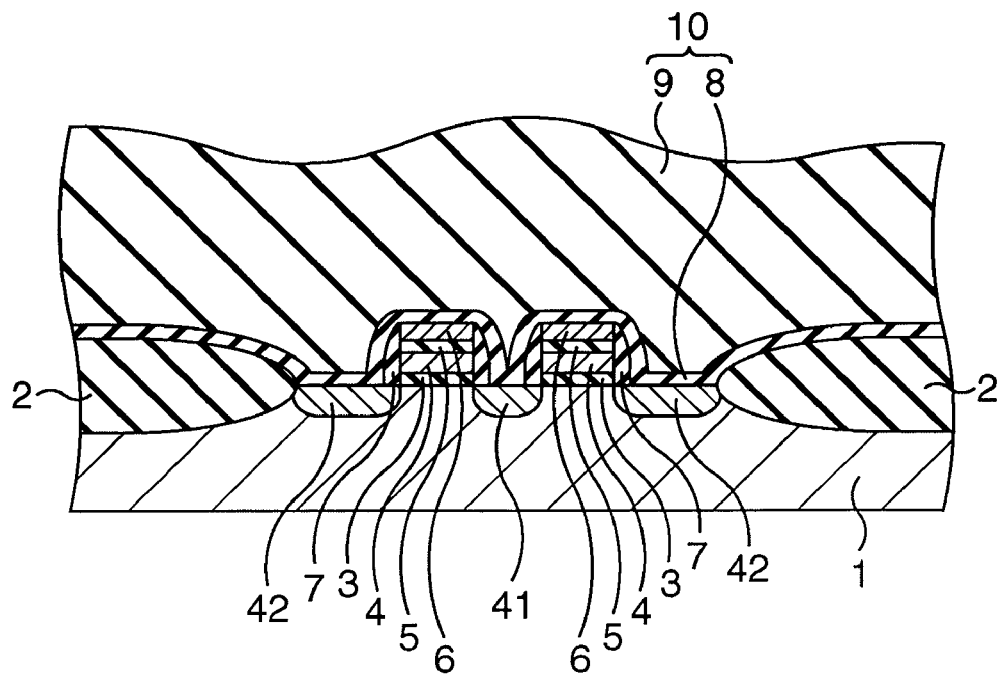
Figure 2C:
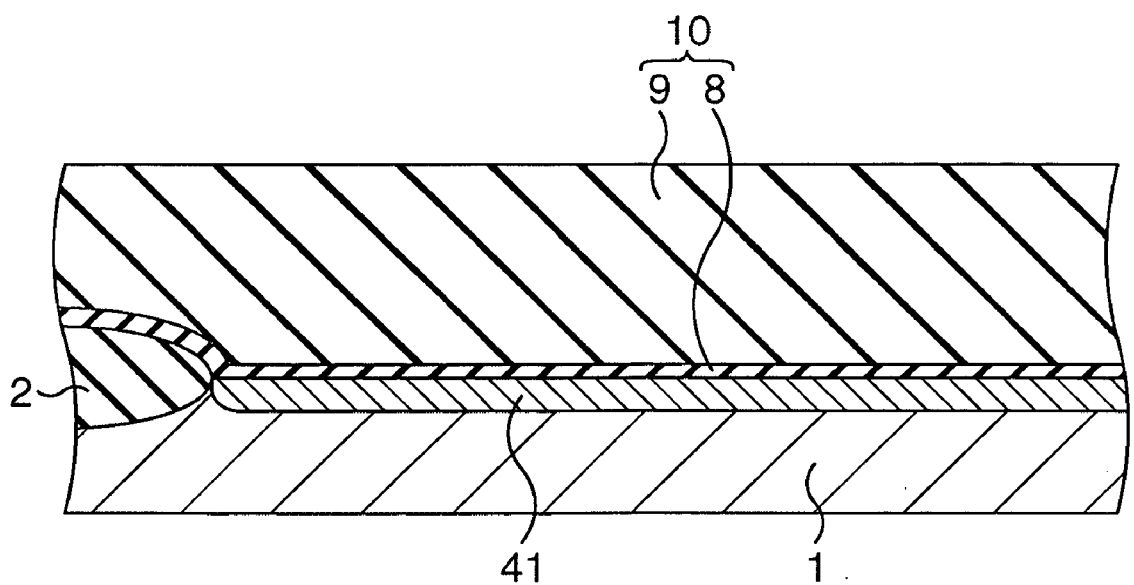

Next, as show in FIG. 1C and FIG. 2C, a BPSG film 9 is formed on the BPSG film 8. A thickness of the BPSG film 9 is, for example, about 1450 nm. The BPSG films 8 and 9 constitute an interlayer insulating film 10. The B concentration in the BPSG film 8 is about five times higher than the B concentration in the BPSG film 9.

Figure 1D:
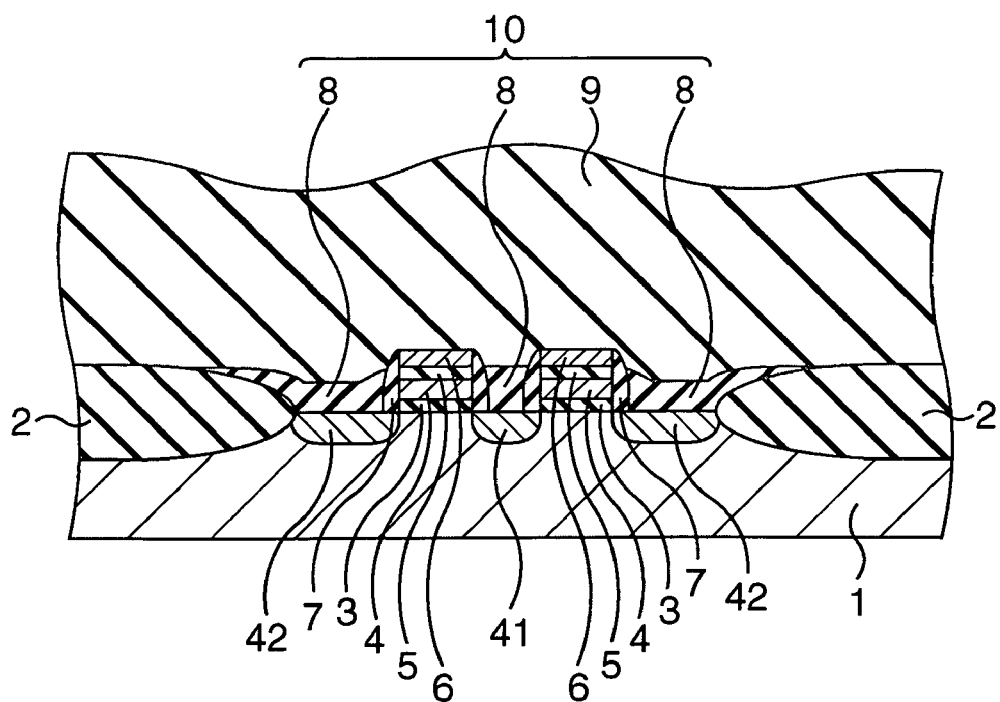
Figure 2D:
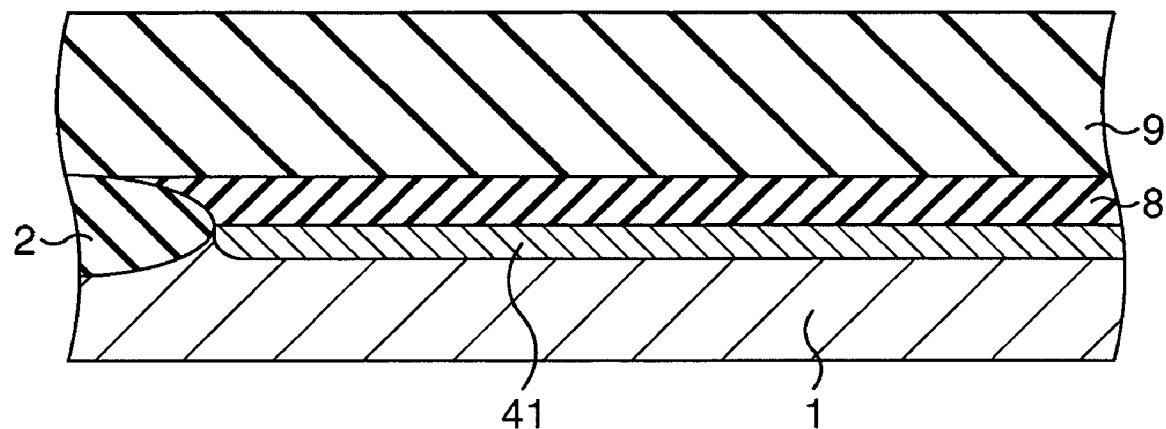

Subsequently, as shown in FIG. 1D and FIG. 2D, a heat treatment to the interlayer insulating film 10 is performed until the BPSG film 8 on each transistor flows onto the source diffusion layer 41 or the drain diffusion layer 42. As a consequence, the BPSG film 8 on the source diffusion layer 41 is isolated from the BPSG film 8 located in other regions. The BPSG film 8 on the drain diffusion layer 42 is also isolated from the BPSG film 8 located in other regions. In other words, the BPSG film 8 becomes substantially independent per source diffusion layer 41 and the drain diffusion layer 42, though the BPSG film 8 slightly remains on an edge portion of the element isolation insulating film 2.

Figure 1E:
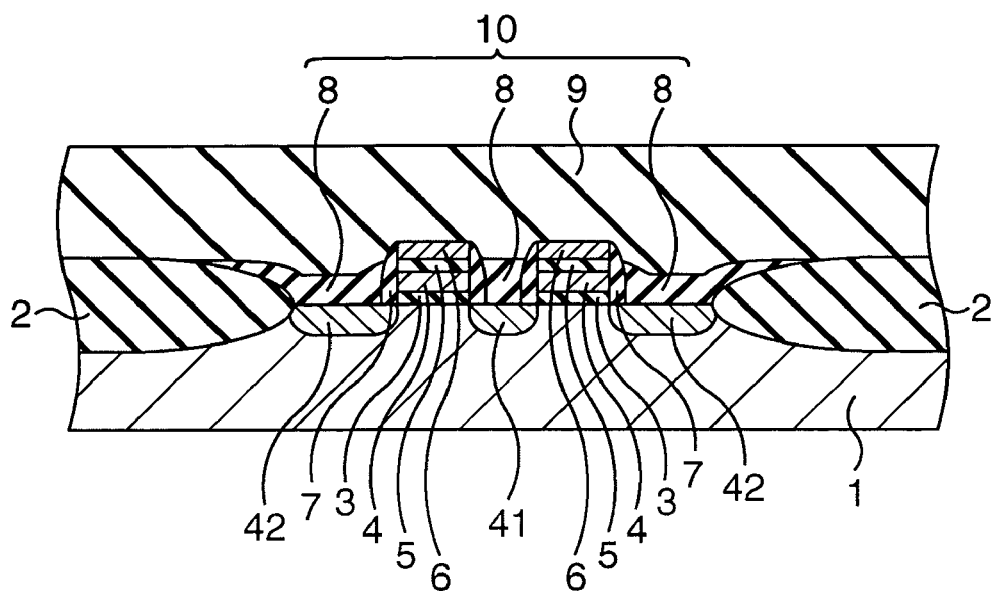
Figure 2E:
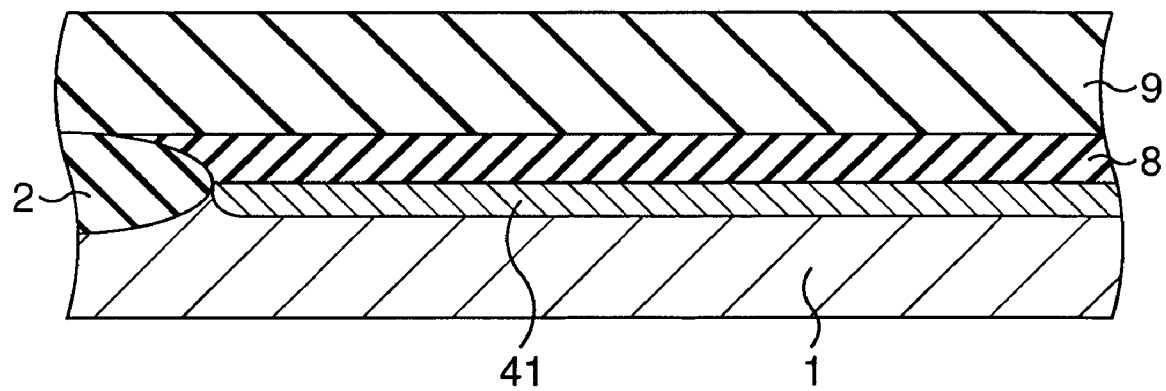

Subsequently, as shown in FIG. 1E and FIG. 2E, a planarization processing of the BPSG film 9 is performed. As the planarization processing, a CMP (Chemical Mechanical Polishing) processing, for example, is performed.

Figure 1F:
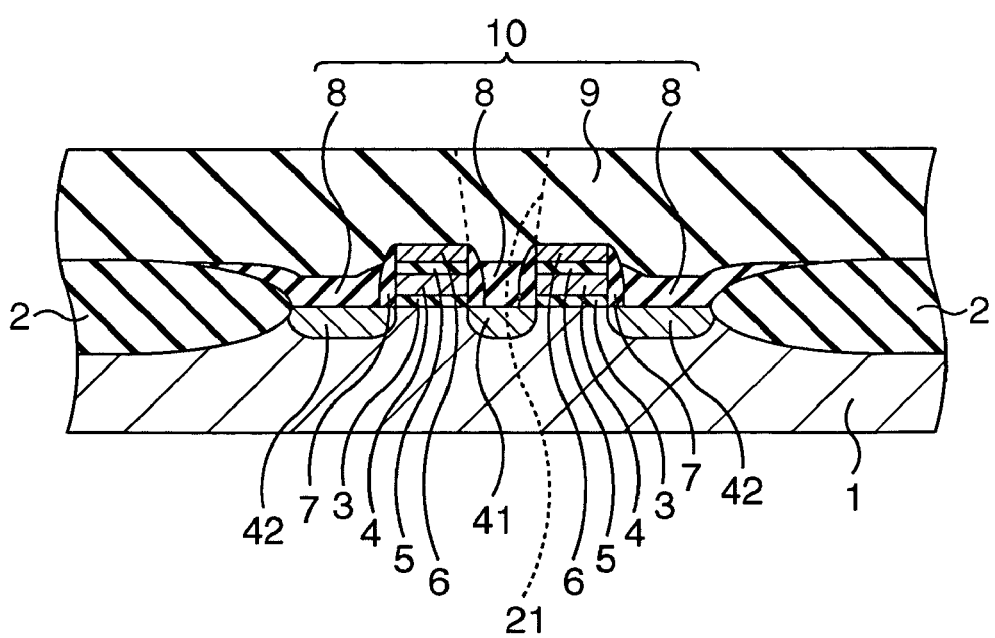
Figure 2F:
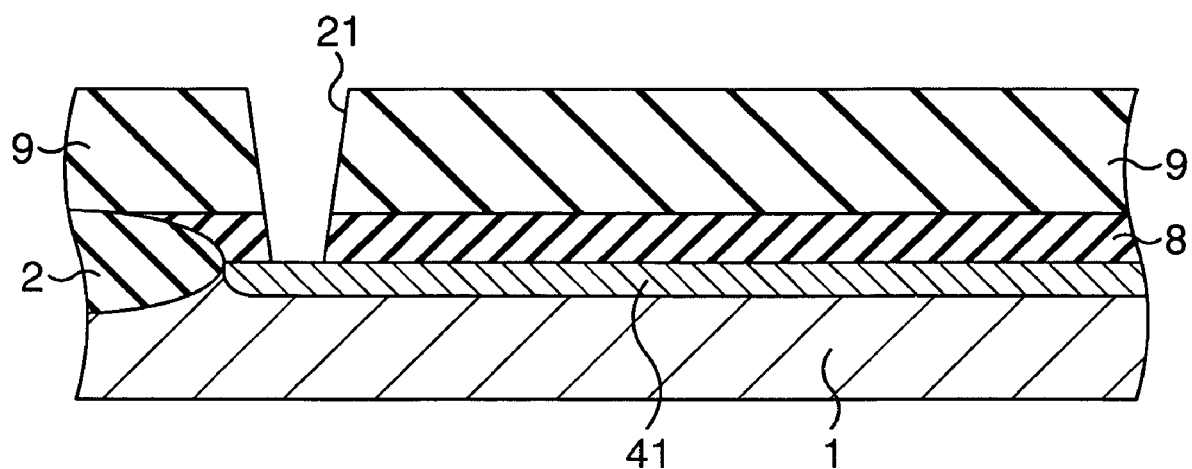

Next, as shown in FIG. 1F and FIG. 2F, a contact hole 21 reaching the source diffusion layer 41 is formed in the BPSG films 8 and 9. A position in which the contact hole 21 is formed is a position apart from an array of the transistors, as shown in FIG. 2F and FIG. 3.

Figure 1G:
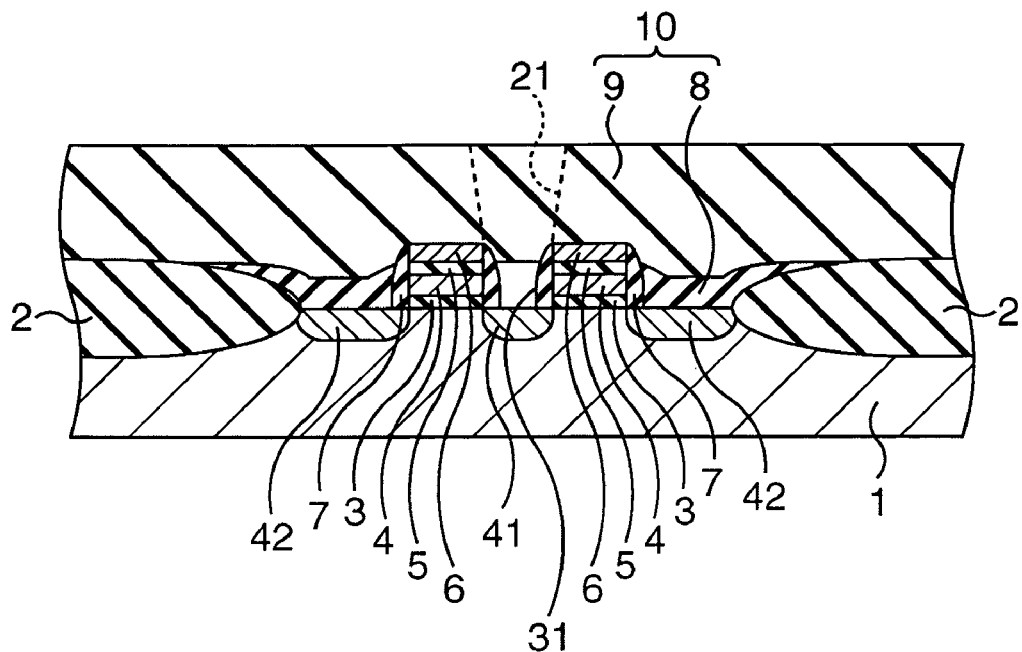
Figure 2G:
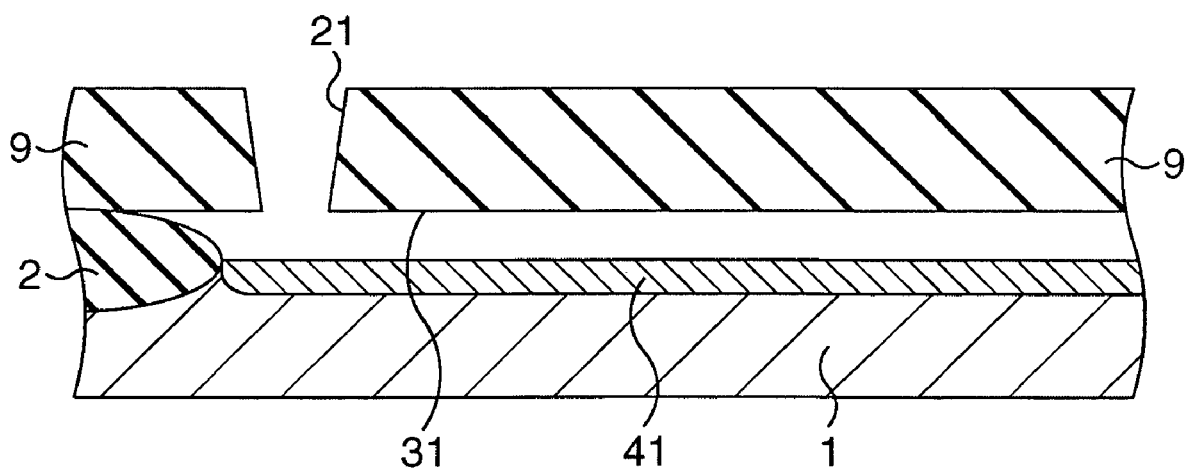

Next, by removing the BPSG film 8 exposed to the contact hole 21 by isotropic etching, a hollow portion 31 connected to the contact hole 21 is formed as shown in FIG. 1G and FIG. 2G. At this time, the BPSG film 8 on the drain diffusion layer 42 is not removed, since the BPSG film 8 on the drain diffusion layer 42 is not connected to the BPSG film 8 on the source diffusion layer 41. In this isotropic etching, 0.5% dilute hydrofluoric acid, for example, is used. Incidentally, since the B concentration of the BPSG film 9 is about one fifth of the B concentration of the BPSG film 8, an etching selection ratio between the BPSG film 8 and the BPSG film 9 is high, and therefore the BPSG film 9 is not removed.

Figure 1H:
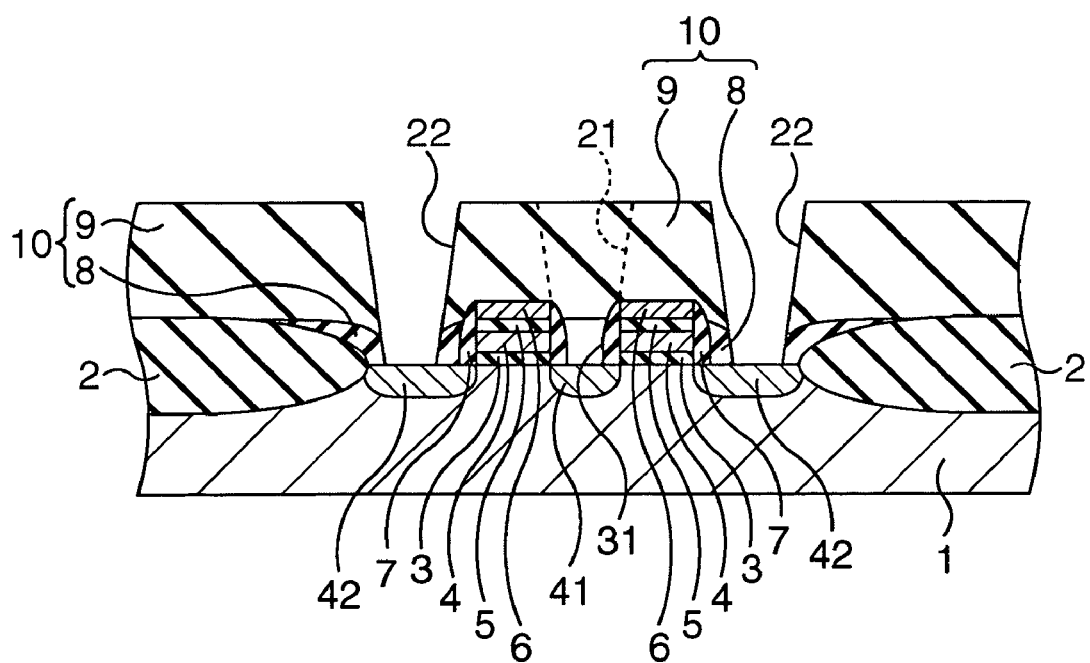
Figure 2H:
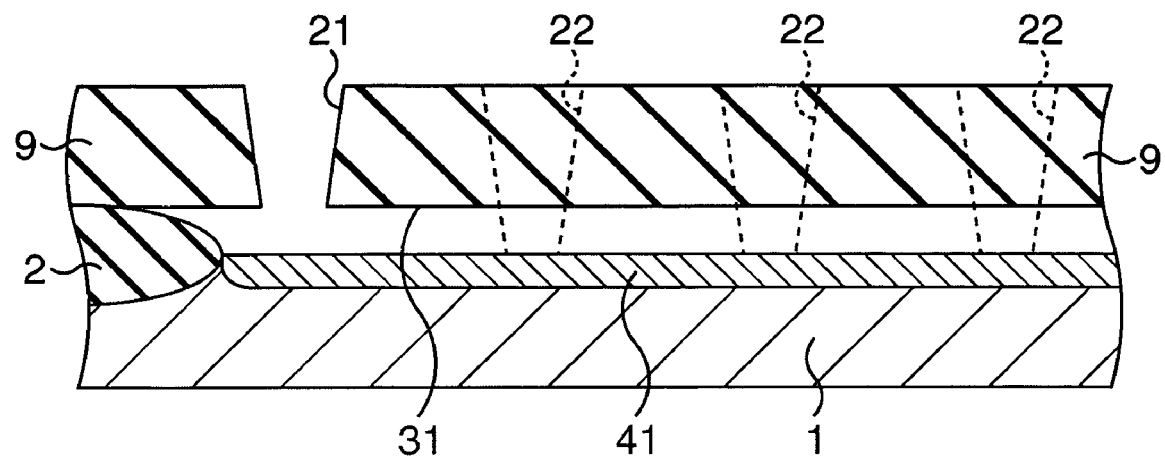

Next, as shown in FIG. 1H and FIG. 2H, a contact hole 22 reaching the drain diffusion layer 42 is formed per each drain diffusion layer 42 in the BPSG films 8 and 9.

Figure 1I:
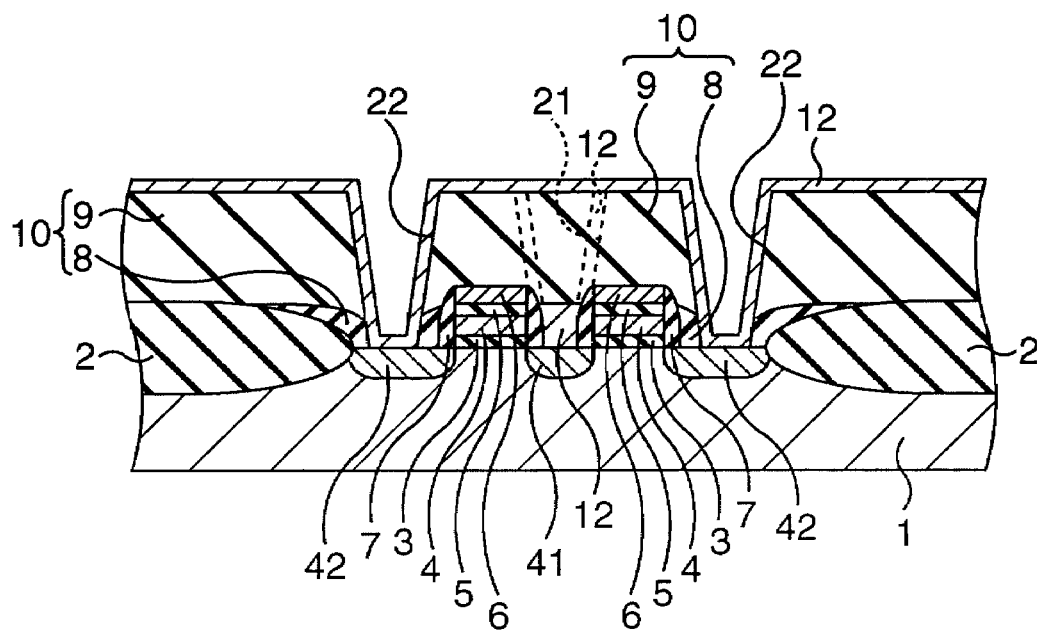
Figure 2I:
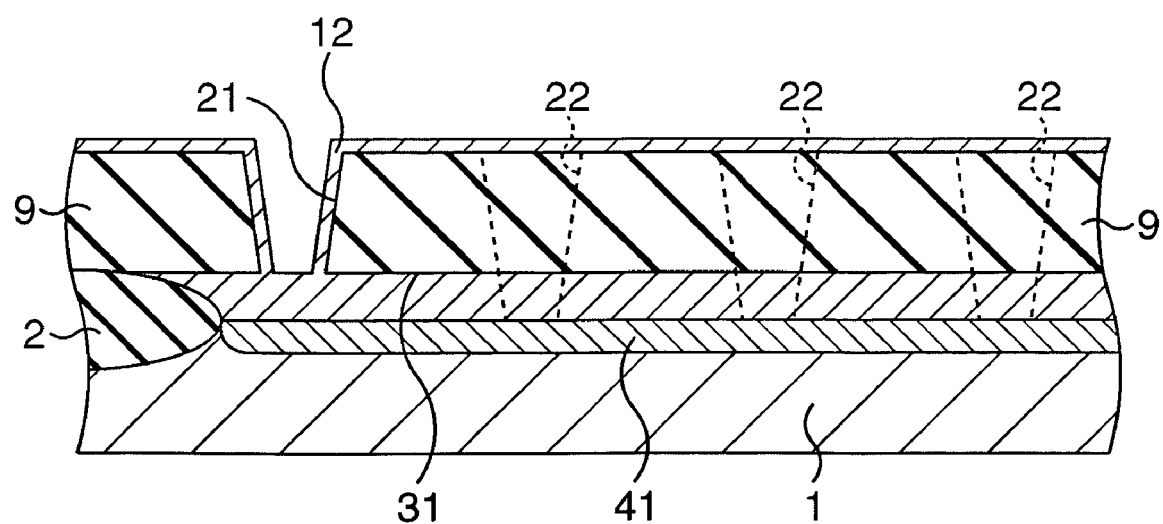

Subsequently, as shown in FIG. 1I and FIG. 2I, a barrier metal film 12 is formed on the entire surface by, for example, a CVD method. The barrier metal film 12 adheres to a surface of the BPSG film 9, a side surface of the contact hole 21 and a side surface of the contact hole 22, and is formed also in the hollow portion 31. A thickness of the barrier metal film 12 on the surface of the BPSG film 9 is, for example, about 100 nm. As the barrier metal film 12, a TiN film is formed, for example. As a consequence, the hollow portion 31 is filled by the barrier metal film 12.

Figure 1J:
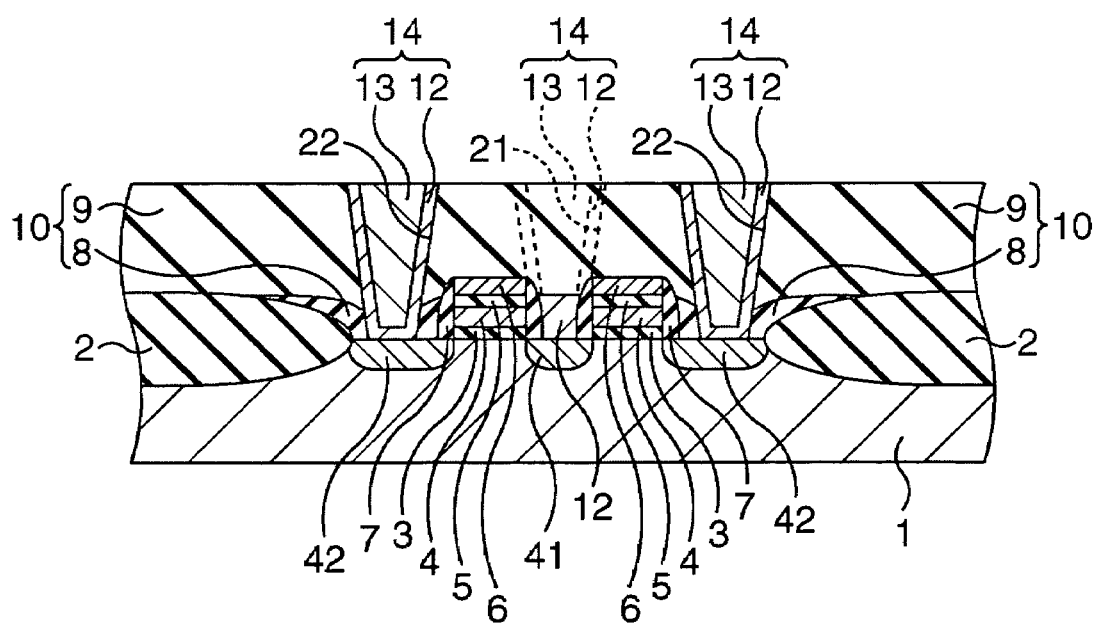
Figure 2J:
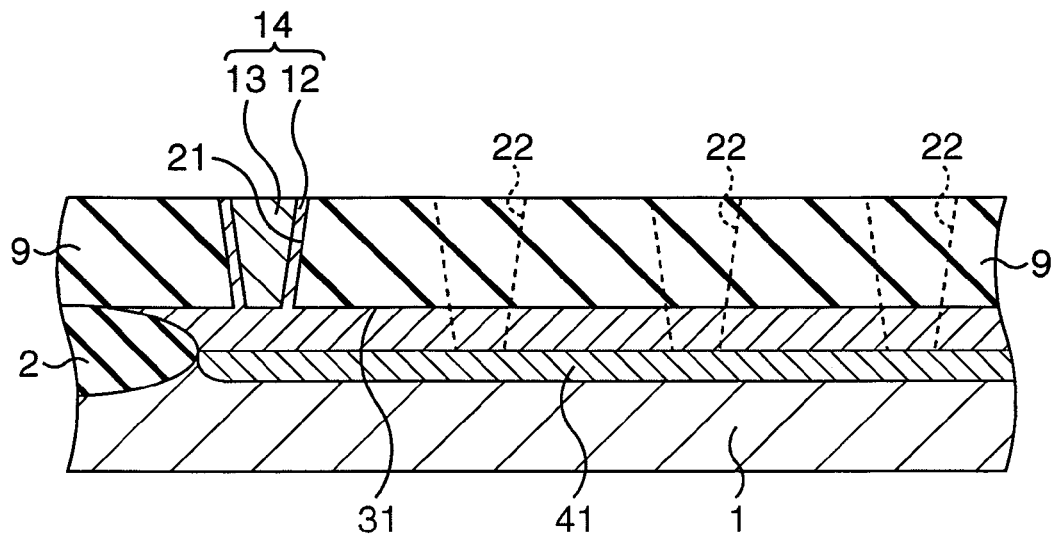

Subsequently, as shown in FIG. 1J and FIG. 2J, by filling W (tungsten) films 13 into the contact holes 21 and 22, contact plugs 14 made of the barrier metal film 12 and the W film 13 are formed. Incidentally, when the contact plug 14 is formed, the barrier metal film 12 and the W film 13 are removed until the BPSG film 9 is exposed by a CMP processing or the like, after the W film 13 is formed on the entire surface.

Figure 1K:
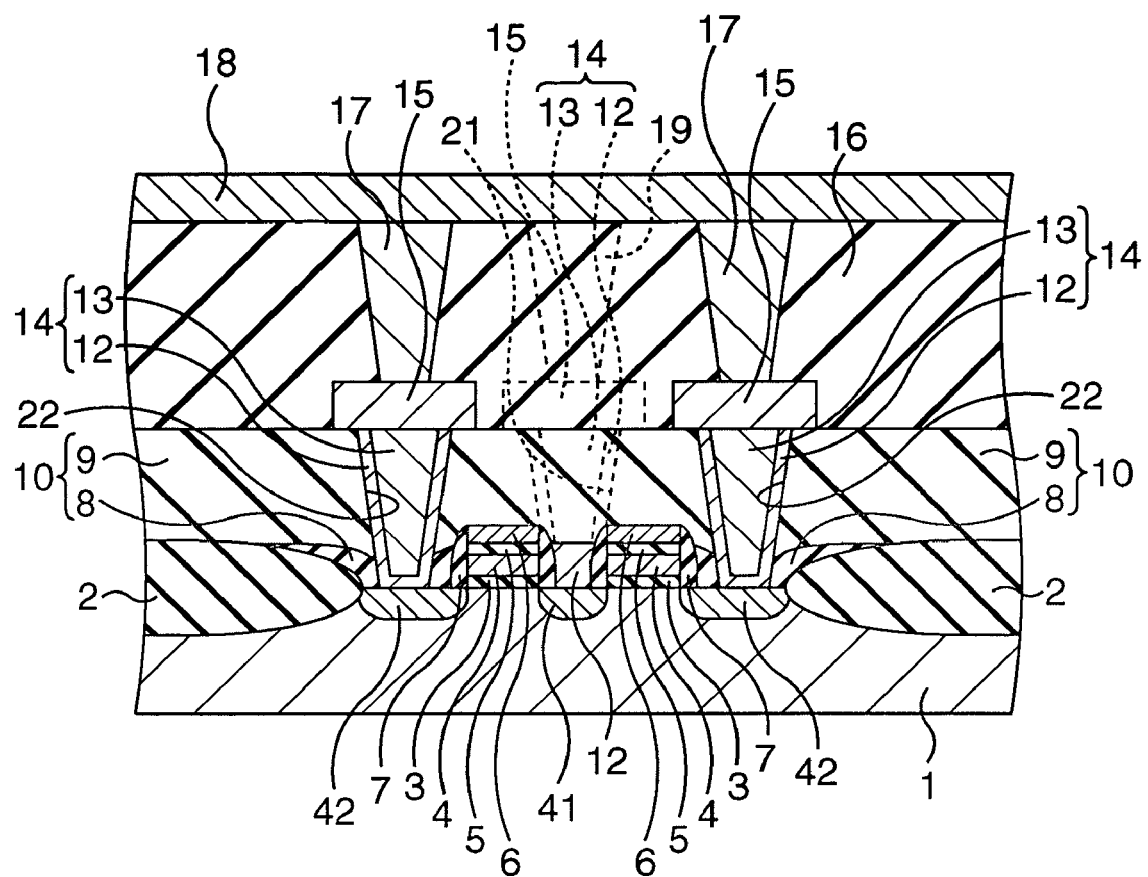
Figure 2K:
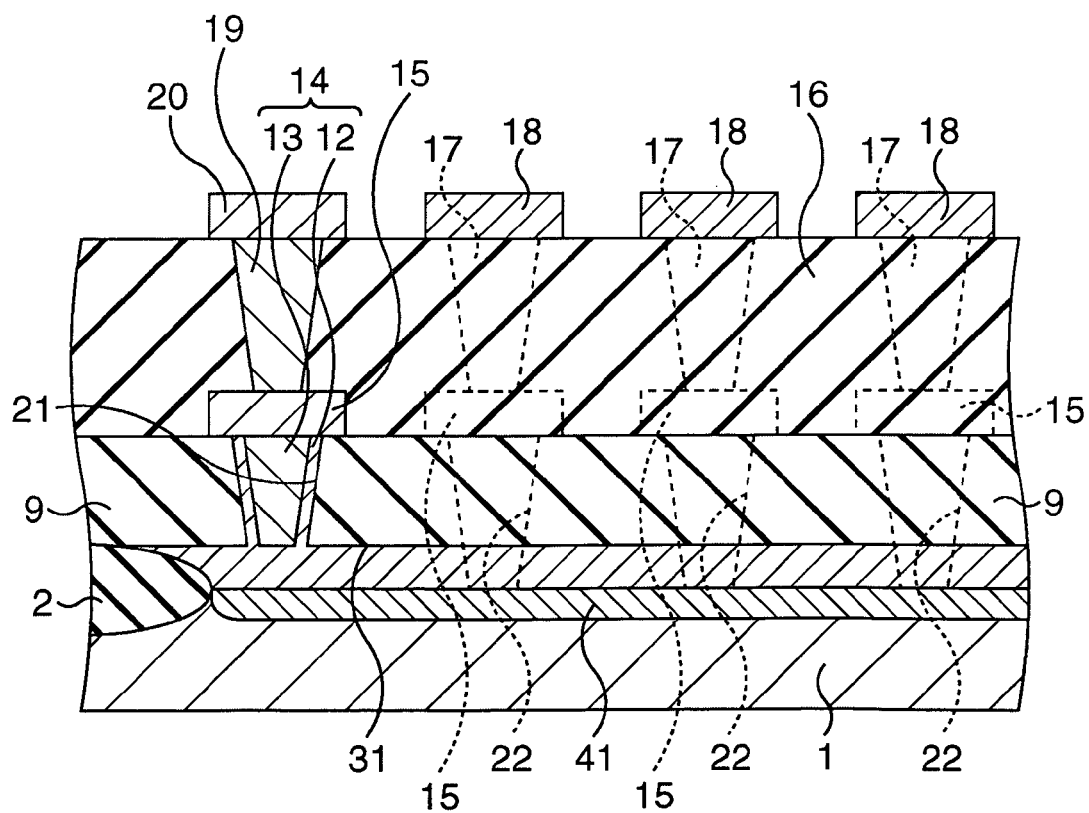

Next, as shown in FIG. 1K and FIG. 2K, per each contact plug 14, a conductive contact pad 15 is formed on the contact plug 14. Next, an interlayer insulating film 16 is formed on the entire surface, and the surface thereof is planarized. Subsequently, per each contact pad 15, a contact hole reaching the contact pad 15 is formed in the interlayer insulating film 16. Then, conductive contact plugs 17 are embedded in the contact holes exposing the contact pads 15 which are electrically connected to the drain diffusion layers 42, while a conductive contact plug 19 is embedded in the contact hole exposing the contact pad 15 which is electrically connected to the source diffusion layer 41. Subsequently, bit lines 18 connecting the contact plugs 17 next to each other in the second direction are formed on the interlayer insulating film 16. Additionally, on the interlayer insulating film 16, a wiring 20 connected to the contact plug 19 is also formed.

Subsequently, interlayer insulting films, wirings and the like of upper layers are formed as necessary, and a semiconductor device is completed.

In a semiconductor device manufactured by the above-described method, the conductive barrier metal film 12 made of TiN, for example, exists directly on the source diffusion layer 41. Consequently, resistance between the wiring 20 for source and the source of each transistor is significantly reduced. Therefore, even without adopting a silicide technology, high speed operation and low voltage operation become possible. Moreover, though it is necessary to form a metal film constituting a silicide layer in order to form the silicide layer, a new material is not required in the present embodiment. Further, the number of necessary process steps is smaller compared with the silicide technology. Consequently, a cost increase is smaller compared with the silicide technology.

Incidentally, though the BPSG film 8 is separated into the part on the source diffusion layer 41 and the parts on the drain diffusion layers 42 by reflowing in the above embodiment, the BPSG film 8 may be separated by other processing. For example, a CMP processing may be performed until the control gate 6 is exposed, before the BPSG film 9 is formed. Moreover, the BPSG film 8 may be patterned by using a lithography technology and an etching technology, before the BPSG film 9 is formed. In other words, any method can be used as long as the BPSG film 8 can be separated into the part of the source diffusion layer 41 side and the part of the drain diffusion layer 42 side with the gate being a boundary.

Meanwhile, two kinds of insulating films constituting the interlayer insulating film 10 are not limited to the BPSG films. Any film can be used as long as the part directly on the source diffusion layer 41 can be isotropically etched more preferentially than a part thereon. If the BPSG film is used, it is preferable that the B concentration of the film of the lower side is five times or more than the B concentration of the film of the upper side. It is because the etching selection ratio may become small if the B concentration of the film of the lower side is less than five times, and removing only the film of the lower side preferentially may become difficult.

In the above embodiment, the conductive film for the purpose of reducing resistance is formed on the source diffusion layer, but the conductive layer can be formed on the drain diffusion layer as necessary. This is effective when the drain diffusion layer is shared between plural transistors.

According to the present invention, since a conductive film exists on an impurity diffusion layer, resistance can be reduced even without adopting a silicide technology. As a result, faster operation and reduced operational voltage become possible also in a semiconductor device in which the silicide technology is not adopted.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device comprising:
    a semiconductor substrate;
    an impurity diffusion layer formed on a surface of said semiconductor substrate;
    transistors in which said impurity diffusion layer is a source diffusion layer or a drain diffusion layer;
    an element isolation film above the semiconductor substrate;
    a first insulating film covering said transistors, wherein a hollow portion extending over said impurity diffusion layer and a contact hole extending upward from said hollow portion to a surface of said first insulating film are formed in said first insulating film;
    a conductive film formed in said hollow portion;
    a contact plug formed in said contact hole, and connecting electrically to said impurity diffusion layer, wherein said conductive film includes the same material as a material included said contact plug; and
    a second insulating film formed at one side of the hollow portion, wherein at least a portion of the second insulating film is provided above the element isolation film and under the first insulating film.

2. The semiconductor device according to claim 1, wherein said conductive film is a TiN film.

3. The semiconductor device according to claim 1, wherein said first insulating film is a BPSG film.

4. The semiconductor device according to claim 1, wherein a silicide layer does not exist on said source diffusion layer and on said drain diffusion layer.

5. The semiconductor device according to claim 1, wherein each of said transistors constitutes a memory cell of a flash memory.

6. The semiconductor device according to claim 1, wherein at least a portion of the conductive film is touch with the impurity diffusion layer.

7. A manufacturing method of a semiconductor device, comprising:
    forming a transistor having a gate electrode, a first impurity diffusion layer and a second impurity diffusion layer on a surface of a semiconductor substrate;
    forming a first insulating film covering said transistor;
    forming a second insulating film on said first insulating film;
    separating said first insulating film into a part of said first impurity diffusion layer side and a part of said second impurity diffusion layer side, with said gate electrode being a boundary;
    forming a contact hole reaching said first impurity diffusion layer in said first and second insulating films;
    forming a hollow portion between said first impurity diffusion layer and said second insulating film by removing said first insulating film exposed to said contact hole; and
    forming a conductive film in said hollow portion.

8. The manufacturing method of a semiconductor device according to claim 7, wherein said transistor shares said first impurity diffusion layer with another transistor.

9. The manufacturing method of a semiconductor device according to claim 7, wherein said separating a first insulating film comprises reflowing said first insulating film by a heat treatment.

10. The manufacturing method of a semiconductor device according to claim 7, wherein a first BPSG film is formed as said first insulating film, and a second BPSG film whose B concentration is higher than that of said first BPSG film is formed as said second insulating film.

11. The manufacturing method of a semiconductor device according to claim 10, wherein said B concentration of said second BPSG film is five times or more than said B concentration of said first BPSG film.

12. The manufacturing method of a semiconductor device according to claim 7, wherein said forming the hollow portion comprises the performing isotropic etching of said first insulating film.

13. The manufacturing method of a semiconductor device according to claim 7, wherein said conductive film is formed by a CVD method.

14. The manufacturing method of a semiconductor device according to claim 7, wherein a TiN film is formed as said conductive film.

15. The manufacturing method of a semiconductor device according to claim 7, wherein said forming the conductive film comprised forming a barrier metal film on a side surface of said contact hole.

16. The manufacturing method of a semiconductor device according to claim 15, further comprising filling a conductive material into the contact hole after said forming the barrier metal film.

17. A manufacturing method of a semiconductor device, comprising:

forming a transistor having a gate electrode, a first impurity diffusion layer and a second impurity diffusion layer on a surface of a semiconductor substrate;

forming a first insulating film which is apart from said second impurity diffusion layer on said first impurity diffusion layer;

forming a second insulating film covering said transistor and said first insulating film;

forming a contact hole reaching said first impurity diffusion layer in said first and second insulating films;

forming a hollow portion between said first impurity diffusion layer and said second insulating film by removing said first insulating film exposed to said contact hole; and forming a conductive film in said hollow portion.

18. The manufacturing method of a semiconductor device according to claim 17, wherein said transistor shares said first impurity diffusion layer with another transistor.

19. The manufacturing method of a semiconductor device according to claim 17, wherein said forming the first insulating film comprises:

forming the first insulating film on an entire surface; and separating said first insulating film into a part of said first impurity diffusion layer side and a part of said second impurity diffusion layer side, with said gate electrode being a boundary, by polishing said first insulating film until said gate electrode is exposed.

20. The manufacturing method of a semiconductor device according to claim 17, wherein said forming the hollow portion comprises performing isotropic etching of said first insulating film.

21. The manufacturing method of a semiconductor device according to claim 17, wherein said conductive film is formed by a CVD method.

* * * * *